United States Patent [19]

Luc

[11] Patent Number: 4,480,779
[45] Date of Patent: Nov. 6, 1984

[54] CONDUCTIVE CONNECTIONS

[75] Inventor: Penelope J. Luc, Bookham, England

[73] Assignee: Luc Technologies Limited, Leatherhead, England

[21] Appl. No.: 417,163

[22] Filed: Sep. 13, 1982

Related U.S. Application Data

[60] Division of Ser. No. 109,644, Apr. 4, 1980, Pat. No. 4,355,199, which is a continuation of Ser. No. 731,082, Oct. 8, 1976, abandoned.

[30] Foreign Application Priority Data

Oct. 10, 1975 [GB] United Kingdom ............... 41691/75

[51] Int. Cl.³ ............................................. B23K 20/12
[52] U.S. Cl. ...................................... 228/112; 228/2; 228/179; 29/840; 29/825; 29/843
[58] Field of Search .............. 174/68.5, 117 A, 117 R; 264/68; 29/840, 843, 860, 877, 843; 228/112, 113, 114, 1 R, 2

[56] References Cited

U.S. PATENT DOCUMENTS

| | | | |
|---|---|---|---|
| 3,082,327 | 3/1963 | Rice | 174/68.5 X |
| 3,192,307 | 6/1965 | Lazar | 174/68.5 |
| 3,597,660 | 8/1971 | Jensen | 361/400 |
| 3,614,374 | 10/1971 | Williams | 219/91.21 |
| 3,794,953 | 2/1974 | Malin | 174/117 A |
| 3,831,262 | 8/1974 | Luc | 228/1 |
| 3,969,815 | 7/1976 | Hacke et al. | 174/68.5 |
| 4,000,054 | 12/1976 | Marcantonio | 174/68.5 |
| 4,067,105 | 1/1978 | Zahn et al. | 174/117 A |

Primary Examiner—R. R Kucia
Attorney, Agent, or Firm—Kenyon & Kenyon

[57] ABSTRACT

A conductive connection between a metallized outer surface of a film of plastics material, such as a polyimide film and a metal or metallized surface of a substrate to which the film is attached. The connection comprises a flexible conductor secured to the substrate and a second film of plastics material which is bonded to the metallized surface of the first film material and to the flexible conductor to effect a conductive connection between the metallized surface of the first film and the substrate. The second film may be so arranged that it holds the flexible conductor in close contact with the metallized layer on the first film to effect an electrical connection but is preferably metallized whereby an additional electrical connection is effected by way of its metallized surface and the flexible conductor.

4 Claims, 10 Drawing Figures

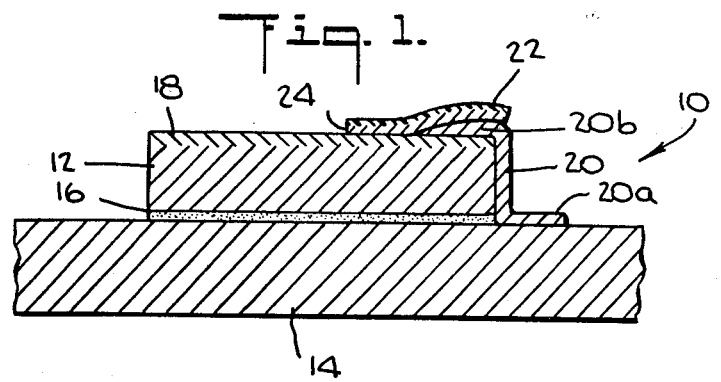
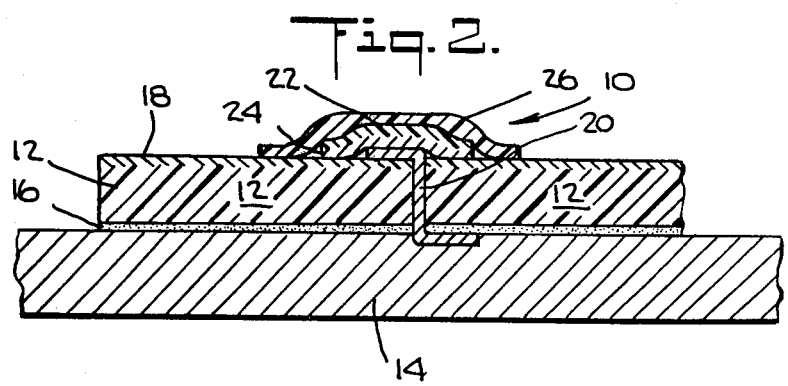
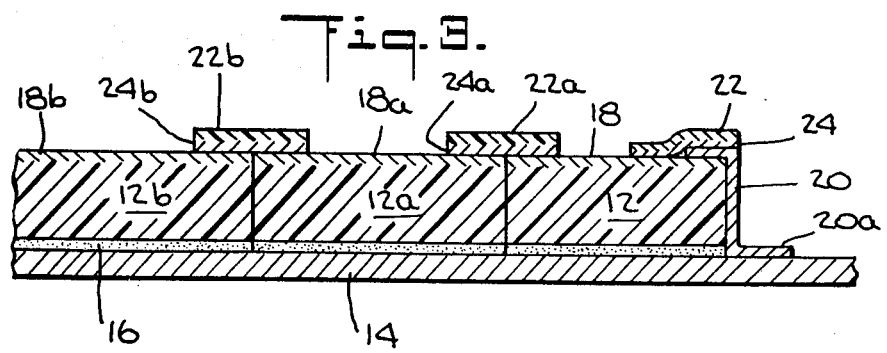

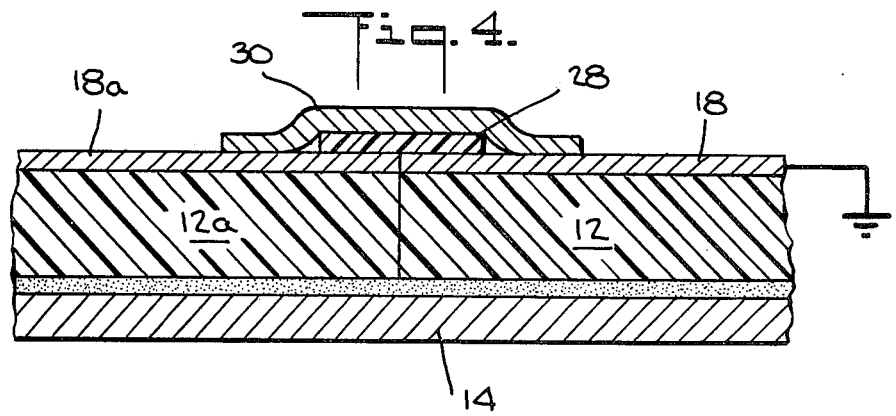
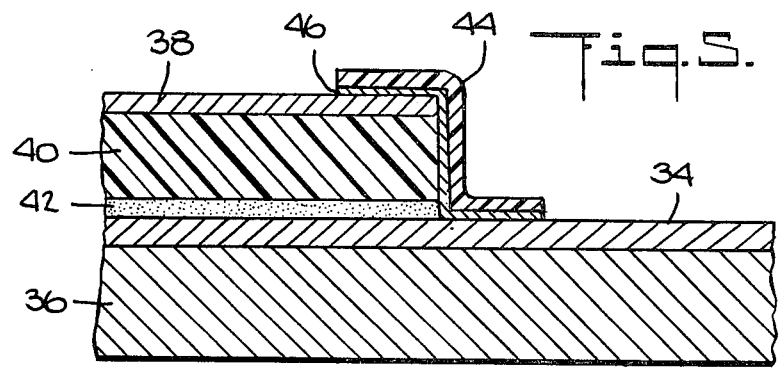
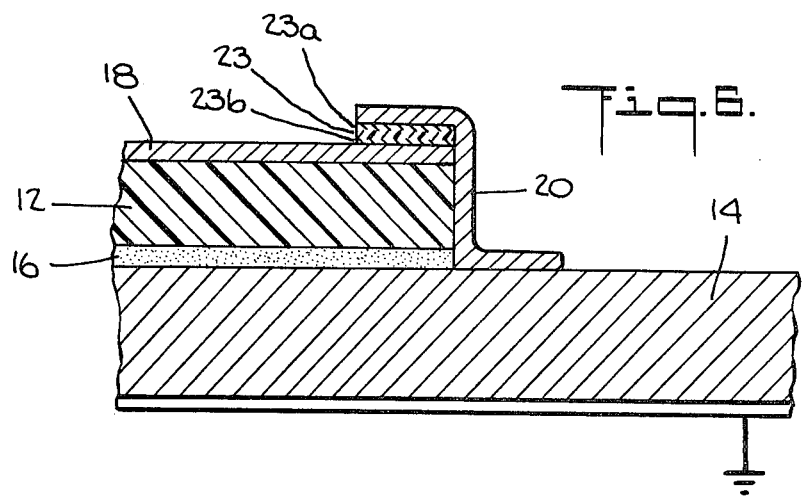

CONDUCTIVE CONNECTIONS

This application is a division of application Ser. No. 109,664, filed Apr. 4, 1980, now U.S. Pat. No. 4,355,199, issued Oct. 19, 1982, which in turn is a continuation of Ser. No. 731,082, filed Oct. 8, 1976 (now abandoned).

BACKGROUND OF THE INVENTION

This invention relates to conductive connections, such as electrically-conductive connections, and concerns connections between a metallized outer surface of a film material and a metal or metallized surface or a substrate to which the film material is attached or partially covers.

DISCUSSION OF THE PRIOR ART

In one application for such an electrical connection a metal body, or a non metal body having a metal coating or a metallized surface, is covered with a film of an insulating material having its outer surface metallized. For operational reasons it is necessary that the metallized surface of the film material be electrically connected to the metal part of the body to avoid the build up of high electrical charge on it which could interfere with electronic mechanisms in the body or cause arcing and damage to such mechanisms or to parts of the structure. The requirement is therefore for the metallised surface to be "grounded" to the body preferably by means of a low resistance electrical connection. This has been found very difficult to achieve in practice.

Because of the complex shapes the body can take, it has been found necessary to use many small pieces of the film, or tape, in order to ensure that the body is covered satisfactorily with the result that it is then necessary to ground each piece of film individually and "in situ", either by direct or indirect bridging contacts.

One example of such a body has a honeycomb structure clad with aluminium and then covered with a plastic film such as Kapton polyimide film (trade mark) about $12\mu$ thick having a vacuum deposited layer of aluminium about $0.06\mu$ thick on its surface remote from the body. The film is secured to the body by, for example, a double sided adhesive tape. Kapton polyimide film is manufactured by Du Pont and is the subject of a bulletin H-2 issued by Du Pont De Nemours International SA and metallized Kapton polyimide film is the subject of a bulletin H-77 issued by the Electrical Insulation Products Division of Du Pont Film Department.

Difficulty arises when attempting to make an electrical connection to such a metallized film in particular because of the extremely thin metallized layer which does not allow a mechanically strong connection to be made by soldering or conventional welding means, or one having a low resistance to current flow.

Three problems which can be encountered in grounding such a tape are:

(1) Any connection between the aluminized surface of the Kapton tape must itself be grounded to the basic structure it is covering. The connection cannot be made by soldering or by welding of the aluminized surface of the tape to the main structure by conventional means. The configuration and nature of the different elements of the whole structure also make it difficult if not impossible to bolt, tap or screw a connection to it, and such connections are found to deteriorate rapidly with time, either by oxidation or in conditions of extreme variations in temperature where expansion and contraction rates of the elements will vary, either causing loss of electrical contact or giving contacts high resistance value. This is particularly true when this structure is made of aluminium honeycomb with a thin aluminium skin on top, or of anodized aluminium as in some spacecraft for example.

(2) As aforementioned, the metallized layer (of the Kapton) can be less than $1\mu$ thick, is fragile and has comparatively poor adhesion to the substrate film on which it has been deposited. Therefore a mechanically strong electrical connection having a low resistance value has heretofore been found impossible to accomplish. Soldering or welding will volatize or damage such a thin layer.

(3) The Kapton film is infusible, having no melting point. It can resist extremes of temperature and has no known organic solvent. It is therefore very often used as thermal and/or electrical insulation, but as a result it cannot itself assist in securing a mechanically strong electrical connection. This is a further reason why it has been found impossible to weld this material or to weld a metal contact to it by conventional means.

SUMMARY OF THE INVENTION

According to the invention there is provided a conductive connection between a metallized outer surface of a first film material and a metal or metallized surface of a substrate to which the first film material is applied, the connection comprising a conductive member having one portion secured to the substrate and a second film material having portions bonded to portions of both the metallized surface of the first film material and the conductive member in such a manner that the conductive connection is formed by way of the conductive member.

Further according to the invention there is provided a method of making an electrical connection between a metallized outer surface of a first film material and a metal or metallized surface of a substrate to which the film material is applied, the method comprising the steps of conductively attaching a portion of a conductive member to the said surface of the substrate and arranging a second film material over portions of the metallized surface of the first film material and the conductive material and bonding it thereto.

The conductive member may have a portion arranged to overlie a portion of the metallized surface of the first or second film material.

The second film material may have a non-metallized surface or surfaces, but preferably at least one surface, such as the surface bonded to the first film material and to the conductive material is metallized. In the first case the second film material is bonded to secure the conductive member against or to the metallized surface of the first film. In the second case, electrical connection is additionally made between the metallized surface of the first film material and the conductive material by way of the metallized surface of the second film.

Preferably the conductive member is in the form of an electrically-conductive material, such as a metal foil or tape of aluminium, copper, silver, gold or other metal and is preferably of the same nature as the structure or the metallized layer of the first film material, or both. Alternatively, the conductive member can if required be of a metallized material. This film can be made of orientated polyester such as polyethylene terephthalate; a film of polyamide such as nylon; fluorocarbon such as fluoroethylene propylene copolymer; or a polyamide-imide material such as "Film 700" (Trade mark of Rhone Poulenc).

The first and second film materials may be the same or different and preferably are of a plastics material. For example, the first film material may be a polyimide film, such as that sold under the trade mark KAPTON; a polyamide-imide; a silicon material; or a thermoplastics material and the second film material may be a plastics material such as a polyimide; an oriented polyester such as polyethylene terephthalate; a thermoplastic material; a polyamide such as nylon; or a fluorocarbon such as fluoroethylene propylene copolymer or a polyamide-imide material such as Film 700 (trade mark). When a polyimide film is used for the first film material, the second film material is preferably a polyester material.

The invention may also comprise an electrical connection between a metallized outer surface of a first film material and a metal or metallized surface of a substrate to which the film material is applied; the electrical connection, comprising a second film material having at least one metallized surface which is laid over or between portions of the metallized surface of said first film and the said surface of the substrate and bonded thereto.

The invention may further comprise a method of making an electrical connection between a metallized outer surface of a first film material and a metal or metallized surface of a member to which the film material is applied, comprising conductively attaching portions of a conductive surface of a second film material to said metallized surface of said first film and to said surface of the member.

The first film material may be applied to the substrate so as to be firmly secured, for example by the use of a suitable adhesive such as a contact adhesive, or may be laid on or formed around the substrate and secured thereto, if necessary, by other means.

Preferably the second film material is bonded to the said metallized surface of the first film material and to the conductive material or the substrate by a process as disclosed and/or claimed in the Complete Specifications of British Pat. Nos. 1,080,442; 1,224,891; 1,380,558; 1,385,473 or U.S. Pat. No. 3,831,262.

DESCRIPTION OF THE DRAWINGS

The invention will now be described by way of example with reference to the accompanying drawings, in which:

FIG. 1 is a cross-sectional view of an embodiment of an electrical connection according to the invention, FIG. 2 is a cross-sectional view of another embodiment of an electrical connection according to the invention, FIG. 3 is a cross-sectional view of another embodiment of a connection according to the invention, FIG. 4 is a cross-sectional view of another embodiment of a connection according to the invention, FIG. 5 is a cross-sectional view of another embodiment of a connection according to the invention, FIG. 6 is a cross-sectional view of another embodiment of a connection according to the invention.

In the various figures of the drawings, which are not drawn to scale, like parts are given like references. In each case, the connection is shown before the welding operation is carried out.

DETAILED DESCRIPTION OF THE INVENTION

Figure 7:
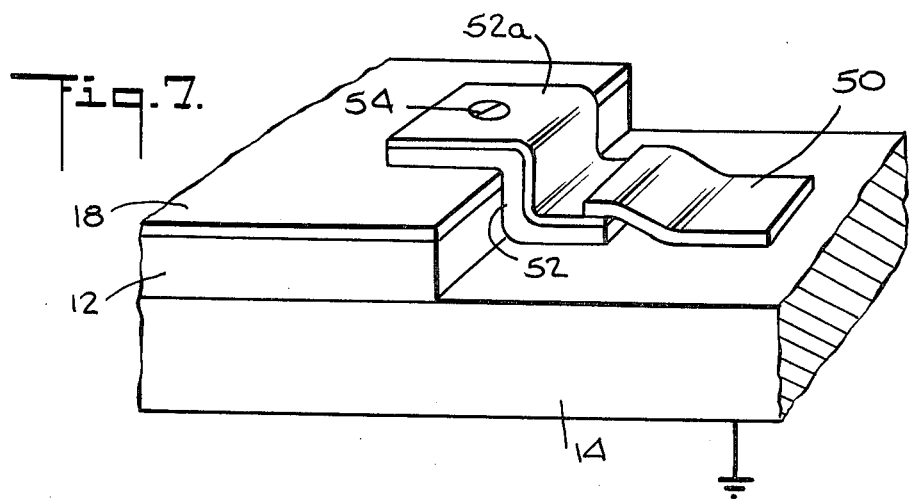
FIGS. 7 to 10 are perspective views of other embodiments of a connection according to the invention.
Figure 8:
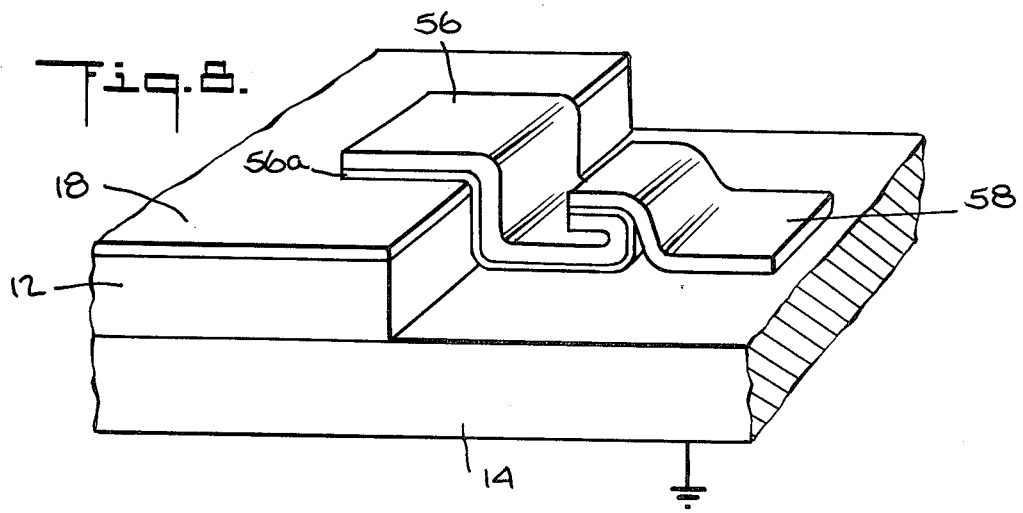

Referring to FIG. 1, there is shown an electrical connection according to the invention. A film 12 of KAPTON (trade mark) polyimide material about $12\mu$ thick is secured to an aluminium substrate 14 by means of a suitable adhesive 16 such as double sided tape supplied by the 3M Company (unknown adhesive), or one of a class of adhesives such as polyamide-imides, fluorocarbons, epoxies, silicones, polyesters, phenolics, rubbers and blends of these. The film 12 has its outer, upper surface 18 (in the drawing) metallized by the vacuum deposition of aluminium to a thickness of about $0.06\mu$ and the electrical connection is made between this metallized layer 18 and the aluminium substrate 14.

A strip 20 of aluminium foil has a portion 20a near one end welded to the substrate 14 and is formed so that a portion 20b near its other end overlies and is in contact with the layer 18. Thus an electrical connection is made between layer 18 and substrate 14 but its permanence could not be guaranteed because of the nature, e.g., flimsiness, of the material of the strip 20, and it is substantially impossible to make a strong weld between the strip 20 and the layer 18.

A second film 22 of a thermoplastics material such as an oriented polyester such as Melinex or Mylar (trade marks) is provided having a metallized surface 24 and is laid over portions of the layer 18 and the conductive member 20 as shown with its metallized layer 24 in contact with the layer 18 and member 20.

The film 22 is then bonded to the layer 18 of film 12 and to the strip 20 to provide a permanent electrical connection from layer 18, through layer 24 and aluminium strip 20 to the substrate 14. The film 22 may be bonded to the film 12 and strip 20 and the conductive member 20 may be bonded to the film 12 by a process such as disclosed in the Specifications of British Pat. Nos. 1,080,442; 1,224,891; 1,380,558; 1,385,473 or U.S. Pat. No. 3,831,262.

In a similar arrangement (not shown) the film 22 can be arranged with its metallized layer 24 remote from the surfaces of layer 18 and the strip 20 to provide a permanent electrical connection from the layer 18 to the substrate 14. Both surfaces of the film 22 could also be metallized.

In another similar arrangement (not shown) the film 22 could be non-metallized and bonded to the metallized layer 18 of film 12 and to the strip 20 securely to hold the strip 20 in position and in good electrical contact with the metallized layer 18.

FIG. 2 shows a cross-sectional view of a modification of the connection of FIG. 1 in which the member 20 extends through a slit formed in the film 12 as shown. In addition, a further film 26 of a thermoplastics material, such as a polyester material, is laid over the film 22 and bonded around its periphery thereto to provide some protection for the film 22. Again, the film 26 may be bonded to the film 22 by one of the aforementioned processes.

In the foregoing embodiments, the conductive strip 20 is shown overlying the film 12 but, while perferable in many cases, it is not necessary.

FIG. 3 is a cross-sectional view of another embodiment, similar to that described with reference to FIG. 1, wherein two further layers 12a, 12b of Kapton film are secured to substrate 14 by means of a suitable adhesive 16. The metallized layer 18 of layer 12 is "grounded" to the substrate 14 as hereinbefore described. The metallized layer 18b of film 12b is electrically connected to the metallized layer 18a of film 12a by means of a film 22b having a metallized surface 24b bonded to the layers 18a, 18b as before. (See 2nd line of fourth paragraph of FIG. 1 description herein. Similarly layer 18a is electrically connected to layer 18 by way of a film 22a having a metallized surface 24a. A good electrical connection can be made even if the metallized layers 24a and 24b are uppermost (in the drawing) and this has the advantage that a layer 24a can be grounded by laying the metallized film 22 over it as well as over the strip 20.

FIG. 4 shows a cross-sectional view of another embodiment of the invention in which the metallized surfaces 18, 18a of two adjacent films 12, 12a are electrically connected by bonding a film 28 of a plastics material such a polyethylene terephthalate, Melinex or Mylar polyester film to the metallised layers 18, 18a and then bonding a conductive, aluminium, foil 30 to the film 28 and to the layers 18, 18a to effect good electrical connection.

FIG. 5 shows another embodiment of a connection according to the invention in which an electrical connection is made between the metal surface 34 of a substrate 36 and the metallized layer 38 of a plastics film 40 such as Kapton, secured to the surface 34 by means of an adhesive 42. In this case a film 44, of a material such as Kapton or other plastics material for example, a polyester film "Film 700" (polyamide-polyimide) or a fluoro-ethylene propylene copolymer F.E.P. or nylon and having a metallized layer 46 is bonded to the layers 38 and 34.

In the foregoing examples it is believed that one or more of the various films or conductive strips could be secured to its associated part, additionally by means of an adhesive. In all cases the adhesive used must be suitable both with regard to compatibility with other materials and the physical and chemical conditions to which it is to be subjected.

FIG. 6 shows a cross-sectional view of an embodiment of a connection according to the invention which is similar in many respects to the connections as described in relation to FIG. 1. In FIG. 6 a film 23, such as a film of a polyester material, a polyamide, a polyamide-imide or a fluoro-carbon, having metallised surfaces 23a and 23b is inserted between the metallised layer 18 and the metal strip 20, and the layers 18, 23 and 20 are bonded together simultaneously to form an electrical connection between layer 18 and the substrate 14. It is found that a good electrical connection can be made if only one surface of the film 23 is metallized. It has also been found advantageous to form an aperture, or apertures through the film 23 to facilitate contact between the aluminium foil 20 and the metallized layer 18 placed face down on the metallized layer 18 of the Kapton film 12 and welded to it. It is then welded to a strip 58 of aluminium or other metal foil by turning the end of the strip back on itself and so welding its metallized side to aluminium foil strip 58 through foil strip 58.

In yet a further development electrical connections have been made between the metallized surfaces of an insulating material such as polyimide, polyamide-imide and silicone materials and thermoplastics materials such as polyamide, polyester or polyolefin and another metallized surface of a similar or dissimilar material by the use of a bridging strap, strip or wire formed of a material capable of being welded under the conditions of a friction welding process, to both materials. For example two pieces of Kapton having metallized surfaces which can be either adjoining or superimposed, can be connected by means of a metallized film of polyester, or of a polyamide-imide, or a polyamide. The film of polyester can be placed metallized face down onto the metallised Kapton or metallised face up, but the electrical contact will nevertheless be established during the welding operation.

Figure 9:
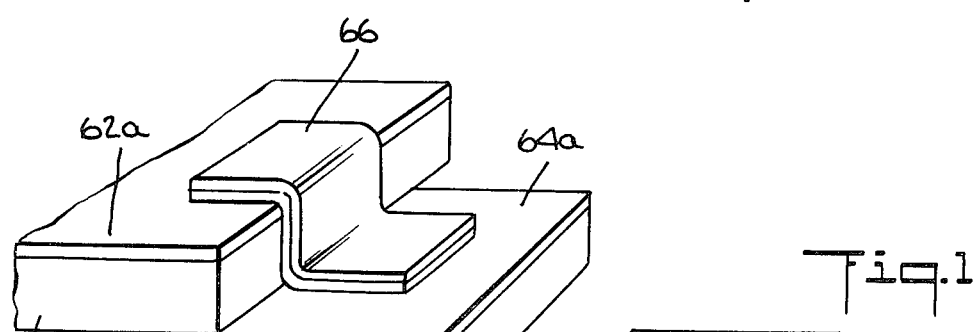
Figure 10:
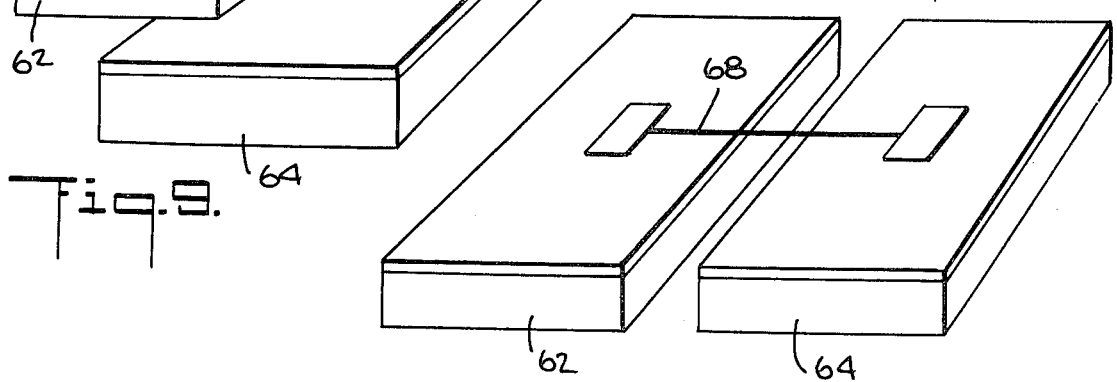

When two pieces 62, 64 of polyester or polyamide-imide or polyamide material having metallized surfaces 62a, 64a are to be electrically connected, this can be done by welding the ends of a strip 66 of a similar material, itself metallized, to each piece to be connected. This will form a bridging contact between the two as shown in FIG. 9. Alternatively, the ends of a strip of metal foil or a wire 68 such as aluminium or copper can be welded to each piece of the metallized material 62, 64 as shown in FIG. 10.

A connection according to this invention of the type shown in FIG. 6 which will "ground" the metallized surface 18 of the first film material 12 to the substrate 14, can be made in the following manner. A polyimide (Kapton type H) film 12 metallized on both surfaces comprises the first film material and is applied to a substrate 14 in the form of a circular tube-like body, forming part of a larger structure, by means of a double sided adhesive. A small slit is made in this first film material 12 before it is applied to the substrate 14. The metallized vacuum deposited layers 18 are of aluminium approximately 1 to 3$\mu$ thick.

To fabricate the connection the method steps are as follows:

(1) A length of half hard aluminium foil 15$\mu$ thick and measuring 20 mm$\times$6 mm comprising the conductive member 20 has one end 20a spot welded to the structure through the slit in the first film material 12 by means of a wheel of hardened steel having a diameter of 25 mm and a contact surface width of 1.5 mm rotating at a speed of 70,000 rpm, which is brought into contact with the upper surface of the foil for 0.25 sec. welding the lower surface of the foil to the substrate.

contact surface or width of 2 mm. While the wheel is rotating at 40,000 rpm its edge or perimeter is brought into contact with a buffer material of polytetrafluoroethylene coated glass cloth covering the connection in the areas where the welds are to be achieved for a period of 0.45 sec. under very light pressure. The welds achieved in this manner establish the electrical connection between the substrate 14 and the metallized surface 18 of the first film material 12. The weld interconnects the conductive member and the first and second film materials. The resistance of this connection when measured remotely is not greater than 10 ohms, while the cover to the connection formed of one end of the conductive member which is welded to the substrate has an electrical connection to this substrate of not more than 0.06 ohms.

The metallized surface 18 of the first film material 12 has a resistance of 3 ohms per cm$^2$. The low resistance of the electrical connection to the structure will however prevent any high electrostatic charge build up on the first film material.

According to this invention an electrical connection of the type shown in FIG. 3 and which serves to create an electrical connection or bridging contact between two sections of similar or dissimilar first film materials can be achieved by laying a length of two sided aluminium metallized polyester film 13 mm long and 6 mm wide and welding it respectively to each section of the first film material. This is done by placing a barrier material in the form of a Kapton type H film over the connection and securing it by two spot welds by use of a wheel of Vespel polyimide material having a diameter of 13 mm and a contact surface or width of 2 mm rotating at a speed of 30,000 rpm which is brought into contact with the barrier material for a period of 0.25 sec. spot welding the metallized layers of the first film materials and the second film material bridge to form an electrical connection between the sections of the first film material. The electrical connection thus formed has a resistance when measured remotely, of less than 15 ohms.

I claim:

1. A method of making a conductive connection between an extremely thin metallized outer surface of a first film material and a metallic surface of a structure to which the film material is applied, said metallized outer surface of said first film material facing away from the metallic surface of the structure, said method comprising:
    (a) providing an integral conductive member having a first portion in direct contact with the metallic surface of the structure and a second portion disposed adjacent the metallized layer of the first film material;
    (b) providing an integral second film material, said second film material being thermoplastic and having at least one metallized surface thereon, a first portion of said second film material being in direct contact with said metallized layer of said first film material and a second portion of said second film material being in direct contact with the portion of said conductive member adjacent the metallized surface of said first film material; and
    (c) bonding the first portion of the conductive member of the metallic surface of the structure with which it is in contact; bonding the first portion of said second film material to the metallized layer of said first film material with which it is in contact to form an electrical connection therebetween; and bonding the second portion of said conductive member and the second portion of said second film material in contact therewith to form an electrical connection to the metallized layer of said first film material, so as to achieve a secured electrical connection between the metallized layer of the first film material and the metallic surface of the structure, the bonding being achieved by a friction bonding process wherein a relative rubbing movement is provided between a tool and the surface of the first and second portions of said conductive member facing away from the surface of the structure and the surface of the first portion of the second film material facing away from the surface of the structure.

2. A method of making a conductive connection between an extremely thin metallized outer surface of a first film material and a metallic surface of a structure to which the film material is applied, said metallized outer surface of said first film material facing away from the metallic surface of the structure, said method comprising:
    (a) providing an integral conductive member having a first portion in direct contact with the metallic surface of the structure and second portion disposed adjacent the metallized layer of the first film material;
    (b) providing an integral second film material, said second film material being thermoplastic and having at least one metallized surface thereon, a first portion of second film material being arranged such that the metallized surface thereon is in direct contact with the metallized layer of said first film material and a second portion of said second film material being arranged such that the metallized surface thereon is in direct contact with the portion of the conductive member adjacent the metallized surface of said first film material; and
    (c) bonding the first portion of the conductive member to the metallic surface of the structure with which it is in contact; bonding the first portion of said second film material to the metallized layer of said first film material with which it is in contact to form an electrical connection therebetween; and bonding the second portion of said conductive member and the second portion of said second film material in contact therewith to form an electrical connection to the metallized layer of said first film material, so as to achieve a secured electrical connection between the metallized layer of the first film material and the metallic surface of the structure, the bonding being achieved by a friction bonding process wherein a relative rubbing movement is provided between a tool and the surface of the first and second portions of said conductive member facing away from the surface of the structure and the surface of the first portion of the second film material facing away from the surface of the structure.

3. A method of making a conductive connection between an extremely thin metallized outer surface of a first film material and a metallic surface of a structure to which the film material is applied, said metallized outer surface of said first film material facing away from the metallic surface of the structure, said method comprising:

(a) providing an integral conductive member having a first portion in direct contact with the metallic surface of the structure and a second portion disposed adjacent the metallized layer of the first film material;

(b) providing an integral second film material, said second film material being thermoplastic and having a metallized surface and a non-metallized surface thereon, a first portion of said second film material being arranged such that the non-metallized surface thereof is in direct contact with the metallized layer of said first film material and a second portion of said second film material being arranged such that the non-metallized surface thereof is in direct contact with the portion of the conductive member adjacent the metallized layer of the first film material; and (c) bonding the first portion of the conductive member to the metallic surface of the structure with which it is in contact; bonding the first portion of said second film material to the metallized layer of said first film material with which it is in contact so as to achieve secured electrical contact of the metallized layer through the non-metallized layer of said second film material; and bonding the second portion of said conductive member and the second portion of said second film material in contact therewith to form an electrical connection to the metallized layer of said first film material, so as to achieve a secured electrical connection between the metallized layer of the first film material and the metallic surface of the structure, the bonding being achieved by a friction bonding process wherein a relative rubbing movement is provided between a tool and the surface of the first and second portions of said conductive member facing away from the surface of the structure and the surface of the first portion of the second film material facing away from the surface of the structure.

4. A conductive connection, comprising:

(a) a structure having a metallic surface;

(b) a first film material affixed to the metallic surface of said structure, said first film material having a metallized layer thereon facing away from the metallic surface of the structure;

(c) a conductive member having a first portion bonded in electrical contact with the metallic surface of said structure and a second portion in direct contact with the metallized layer of said first film material; and (d) an integral second film material, which is thermoplastic and which has at least one metallized surface thereon, having a first portion bonded to the metallized layer of said first film material to form an electrical connection therewith and a second portion overlying and in contact with the second portion of said conductive member, said second portion of said conductive member being bonded in electrical contact to said metallized layer of said first film material by a bond impressed upon said second portion of said second film material, the bonding being achieved by a friction bonding process wherein a relative rubbing movement is provided between a tool and the surface of the first and second portions of said conductive member facing away from the surface of the structure and the surface of the first portion of the second film material facing away from the surface of the structure.

* * * * *